United States Patent [19]
Suzuki et al.

[11] Patent Number: 6,026,106
[45] Date of Patent: Feb. 15, 2000

[54] COMPOSITE OPTICAL DEVICE

[75] Inventors: Daisuke Suzuki; Tatsuya Kimura; Tohru Takiguchi, all of Tokyo, Japan

[73] Assignee: Mitsubishi Denki Kabushiki Kaisha, Tokyo, Japan

[21] Appl. No.: 08/933,307

[22] Filed: Sep. 18, 1997

[30] Foreign Application Priority Data

Mar. 26, 1997 [JP] Japan ................................. 9-073206

[51] Int. Cl.⁷ .................................................. H01S 3/19
[52] U.S. Cl. .................................................. 372/50
[58] Field of Search ......................... 372/50, 46, 26

[56] References Cited

U.S. PATENT DOCUMENTS

| | | | |
|---|---|---|---|
| 4,618,959 | 10/1986 | Mito | 372/46 |
| 4,669,086 | 5/1987 | Kaede et al. | 372/50 |
| 5,825,047 | 10/1998 | Ajisawa et al. | 372/26 |

FOREIGN PATENT DOCUMENTS 7162093  6/1995  Japan .

OTHER PUBLICATIONS

Nordell et al., "Improved InP Regrowth Properties In Metalorganic Vapor Phase Epitaxy By Addition of $CCl_4$", Applied Physics Letters, vol. 61, No. 1, Jul. 1992, pp. 22–24.

*Primary Examiner*—Rodney Bovernick
*Assistant Examiner*—Quyen Phan Leung
*Attorney, Agent, or Firm*—Leydig, Voit & Mayer, Ltd.

[57] ABSTRACT

A composite optical device having a high efficiency of coupling a laser diode and an optical device and a method of producing the composite optical device. The composite optical device connects a laser diode with a first mesa including an active layer on a (001) plane of a compound semiconductor substrate via a first cladding layer and an optical device provided with a second mesa including an optical waveguide layer formed on the (001) plane via a second cladding layer, wherein one end of the active layer and one end of the optical waveguide layer oppose each other at a distance smaller than the thicknesses of the first and second cladding layers. At least the second cladding layer is grown in an ambient supplemented with HCl to produce a planar surface.

8 Claims, 9 Drawing Sheets

Plan View

COMPOSITE OPTICAL DEVICE

BACKGROUND OF THE INVENTION

1. Field of the Invention

The present invention relates to a composite optical device. More particularly, it relates to a composite optical device comprising a semiconductor laser diode and a light modulator.

2. Description of the Prior Art

Recently, semiconductor laser diodes combined with light modulators have come to be used widely as composite optical devices formed on semiconductor substrates. However, a semiconductor laser diode combined with a light modulator for modulation at a frequency as high as 40 GHz, for example, requires a multiple quantum well (MQW) active layer in a laser portion and an MQW light absorption layer in a light modulator portion that are different in composition from each other. Therefore, a semiconductor laser diode including a light modulator for modulation at a high frequency is made by forming different layers in the laser portion and etching them into specified shapes to form a semiconductor laser diode and then embedding the layers in the light modulator portion during epitaxial growth, thereby forming the light modulator. Conventional semiconductor laser diodes including light modulators made in such a process have various problems at the junction of the semiconductor laser diode and the light modulator, as described below, and are, therefore, unable to provide sufficient performance.

In the conventional semiconductor laser diode and light modulator, as shown in FIG. 11, an n-InP cladding layer 2, an InGaAs/InGaAsP MQW active layer 3, a p-InP cladding layer 4, a p-InGaAsP guide layer 5, and a p-InP cladding layer 7, located on top of the other layers, are grown on the surface of an n-InP semiconductor substrate 1. The crystalline orientation of the surface is (001). A stripe $SiO_2$ film 8 is formed in the [110] direction on the layer 7 and the layers are etched by using the $SiO_2$ film 8 as a mask, thereby forming a laser mesa of the semiconductor laser diode in the [110] direction. In this description, notations n- and p- represent n type and p type conductivity semiconductor materials, respectively.

Then, using the $SiO_2$ film 8 as a selective growth mask, an n-InP cladding layer 109, an InGaAsP/AlInAs MQW absorption layer 110, and a p-InP cladding layer 111 are grown sequentially. Those layers are etched to make a modulator mesa of the light modulator linked to an end face of the laser mesa of the semiconductor laser diode.

An Fe-doped InP embedding layer and an n-InP current blocking layer are grown successively on both sides of the laser mesa and the modulator mesa. After removing the n-InP current blocking layer from an isolation region between the laser and the light modulator, a p-InP cladding layer and a p-InGaAs contact layer are grown successively, and the p-InGaAs contact layer is removed from the isolation region. Then, electrodes are formed on the p-InGaAs contact layer of the laser and on the p-InGaAs contact layer of the light modulator, which are separated by the isolation region, and an electrode is formed on the back side of the n-InP substrate, completing the conventional semiconductor laser diode and light modulator. The isolation region electrically isolates the laser and light modulator portions at the junction of the laser mesa and the modulator mesa, where a layer having relatively high conductivity is removed from the isolation region.

However, in the conventional semiconductor laser diode and light modulator, when the n cladding layer 109, the light absorption layer 110, and the p cladding layer 111 are grown on the (001) surface of the n-InP semiconductor substrate 1, after forming the laser mesa, as shown in FIG. 11, the layers also grow on the end face of the laser mesa (the end face being a plane having a (110) orientation), as shown in FIG. 11 and FIG. 12. Consequently, the n-InP cladding layer 111 overlaps the $SiO_2$ film 8, resulting in formation of a convex portion, and the end face of the light absorption layer 110 does not squarely face the end face of the active layer 3. This results in problems such as growth failure of the p-InGaAs contact layer or the like on the layer in the convex area and failure to remove completely the n-InP current blocking layer from the isolation region, resulting in insufficient isolation of the laser portion and the light modulator. Also, the distance between the light absorption layer 110 and the active layer 3 is increased and the end face of the light absorption layer 110 and the active layer 3 cannot oppose each other, thus resulting in lower light coupling efficiency.

The foregoing description of the prior art deals with a semiconductor laser diode and light modulator, although the aforementioned problem is not limited to semiconductor laser diodes including a light modulator but is also found commonly in a junction of a semiconductor laser diode and other optical devices, such as an optical switch and an optical divider, which are formed by growing different layers on a common semiconductor substrate.

SUMMARY OF THE INVENTION

An object of the present invention is to solve the problems of the prior art described above and to provide a composite optical device having a high efficiency in coupling a laser diode and an optical device on a common semiconductor substrate, and a method for producing the composite optical device.

The present inventors have found that, by making use of the fact that metal organic chemical vapor deposition (MOCVD) growth is suppressed in a particular crystalline plane when an ambient is supplemented with HCl, one end of the active layer and one end of the optical waveguide layer can be formed close to each other, even when the active layer and the optical waveguide layer are formed in separate growth processes.

The present invention provides a composite optical device comprising a laser diode with a first semiconductor mesa including an active layer formed on an (001) plane of a compound semiconductor substrate with an intervening first cladding layer, and an optical device with a second semiconductor mesa including an optical waveguide layer formed on the (001) plane with an intervening second cladding layer, wherein the active layer has an end opposed to an end of the optical waveguide separated by a distance smaller than the thicknesses of the first and second cladding layers.

A composite optical device of the present invention preferably has the first semiconductor mesa in the [110] direction and one end of the first semiconductor mesa is substantially at a right angle to the [110] direction.

In a composite optical device of the present invention, it is further preferable that the end face of the first semiconductor mesa form an angle in a range from 85 to 95 degrees with the [110] direction.

In a composite optical device of the present invention, the end face of the first semiconductor mesa may also form an angle in a range from 0 to 45 degrees, inclusive, with the [110] direction.

In a composite optical device of the present invention, when the end face of the first semiconductor mesa forms an angle in a range from 0 to 45 degrees with the [110] direction, it is preferable that the longitudinal direction of the active layer be substantially the [110] direction.

A composite optical device of the present invention may also have the end face of the first semiconductor mesa forming an angle less than ±5 degrees with the [1/10] direction. Symbol "/" within a bracket [ ] throughout this description represents a bar (–) to be placed over the digit that follows.

In a composite optical device of the present invention, it is preferable that the distance between an end face of the active layer and an end face of the optical waveguide layer be not greater than 0.5 µm.

In a composite optical device of the present invention, the optical device may be a light modulator in which the optical waveguide layer changes light absorption according to an applied electric field.

The present invention provides a method for producing a composite optical device by connecting a laser diode having a first semiconductor mesa that includes an active layer on an (001) surface of a compound semiconductor substrate with an intervening first cladding layer, and an optical device having a second semiconductor mesa that includes the optical waveguide layer on the (001) surface with an intervening second cladding layer. The method comprises:

forming a first semiconductor mesa having a [110] longitudinal direction and one end face substantially at a right angle to the [110] direction;

growing a plurality of semiconductor layers including a second cladding layer and an optical waveguide layer in an ambient including chlorine;

forming an insulating film extending from over the first semiconductor mesa onto the plurality of semiconductor layers previously grown and substantially in the [110] direction; and forming a second semiconductor mesa connected to the first semiconductor mesa by etching, using the insulating film as a mask.

The present invention also provides a method for producing a composite optical device connecting a laser diode having a first semiconductor mesa that includes an active layer on an (001) surface of a compound semiconductor substrate with an intervening first cladding layer, and an optical device having a second semiconductor mesa that includes an optical waveguide layer on the (001) surface with an intervening second cladding layer. The method comprises:

forming a first semiconductor mesa so in the [110] direction and having an end face inclined by about 45 degrees to the [110] direction;

growing a plurality of semiconductor layers including a second cladding layer and an optical waveguide layer in an ambient including chlorine;

forming an insulating film extending from the first semiconductor mesa onto a plurality of semiconductor layers previously grown and in the [110] direction; and forming a second semiconductor mesa connected to the first semiconductor mesa by etching, using the insulating film as a mask.

DETAILED DESCRIPTION OF THE INVENTION

Figure 1:
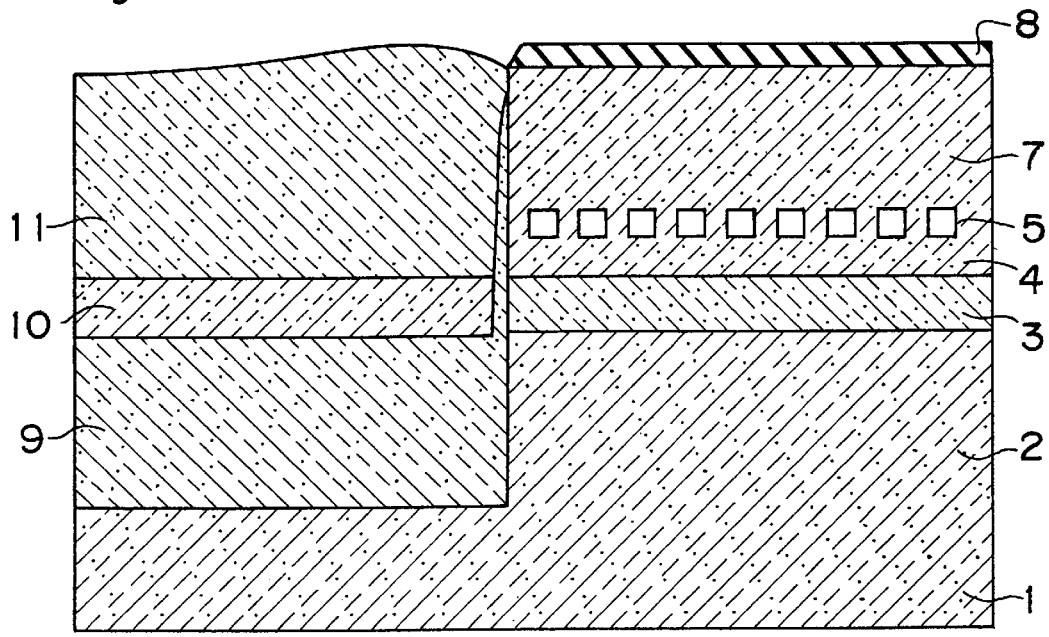
FIG. 1 is a cross sectional view showing schematically the junction of a semiconductor laser diode and a light modulator according to a first embodiment of the present invention.

The composite optical device of the present invention comprises a laser diode having a mesa in a configuration that includes an active layer on an (001) surface of a compound semiconductor substrate with an intervening first cladding layer, and a light modulator having a second mesa in a configuration that includes an optical waveguide layer on the (001) surface with an intervening second cladding layer, wherein one end of the active layer and one end of the optical waveguide layer oppose each other at a distance smaller than the thicknesses of the first and second cladding layers. Therefore, an extremely high coupling efficiency between the laser diode and the optical device can be achieved.

In the composite optical device of the present invention, the first semiconductor mesa has a longitudinal direction substantially along with the [110] direction, and an end of the first semiconductor mesa including an end of the active layer is substantially perpendicular to the [110] direction so that an end of the active layer and an end of the optical waveguide layer are located close to and opposite each other.

In the composite optical device of the present invention, an end of the first semiconductor mesa forms an angle in a range from 85 degrees to 95 degrees with the [110] direction so that an end of the active layer and an end of the optical waveguide layer are located close to and opposite each other.

In the composite optical device of the present invention, an end of the first semiconductor mesa forms an angle in a range from 0 degrees to 45 degrees with the [110] direction so that an end of the optical waveguide layer and an end of the active layer are located close to and opposite each other.

In the composite optical device of the present invention, when an end of the first semiconductor mesa forms an angle of about 45 degrees with the [110] direction, reflection between the active layer and the optical waveguide layer is suppressed by making the longitudinal direction of the active layer substantially coincide with the [110] direction so that the coupling efficiency is improved further.

In the composite optical device of the present invention, even when an end of the first semiconductor mesa forms an angle less than ±5 degrees with the [1/10] direction, an end of the optical waveguide layer and an end of the active layer can be close to and opposite each other.

In the composite optical device of the present invention, coupling efficiency can be improved by arranging the active layer and the optical waveguide layer so that the distance between their end facets is within 0.5 $\mu$m.

The composite optical device of the present invention modulates a laser beam in the light modulator in which light absorption changes according to an applied electric field.

The first method of producing the composite device of the present invention includes forming the first semiconductor mesa in the [110] direction so that one end of the first semiconductor mesa is substantially perpendicular to the [110] direction and growing a plurality of semiconductor layers including the second cladding layer and the optical waveguide layer in an ambient supplemented with HCl so that the first semiconductor mesa is embedded. Therefore, an end of the active layer and an end of the optical waveguide layer are located close to and opposite each other, and the composite optical device has an extremely high coupling efficiency between the laser diode and the optical device.

The second method of producing the composite device of the present invention includes forming the first semiconductor mesa in the [110] direction so that an end of the first semiconductor mesa crosses the [110] direction at an angle of about 45 degrees, growing a plurality of semiconductor layers including the second cladding layer and the optical waveguide layer in an ambient supplemented with HCl so that the first semiconductor mesa is embedded, forming an insulating film extending from the first semiconductor mesa to the plurality of grown semiconductors layers so that the longitudinal direction is substantially the [110] direction, and forming the second semiconductor mesa connected to the first semiconductor mesa using the insulating film as an etching mask. Therefore, an end of the active layer and an end of the optical waveguide layer are located close to and opposite each other so that the composite optical device has an extremely high coupling efficiency between the laser diode and the optical device.

DETAILED DESCRIPTION OF PREFERRED EMBODIMENTS

Preferred embodiments of the present invention are described with reference to the accompanying drawings.
Embodiment 1

A first embodiment of the present invention is a semiconductor laser diode including a light modulator, wherein an end face of the laser mesa is in a specified crystalline plane while an n-InP cladding layer 9, an active layer 10, and a p-InP cladding layer 11 of the modulator mesa in the light modulator are grown by MOCVD in an ambient supplemented with HCl. In this configuration, the active layer 3 and the absorption layer 10 end faces are close to and opposite each other, as described in detail later. Therefore, because an extremely high coupling efficiency of the active layer 3 and the absorption layer 10 is achieved and the p-InP cladding layer 11 can be planar without any concave portion in the junction, as shown in FIG. 1, a p-InP cladding layer 16 and a p-InGaAs contact layer are formed without growth defects.

A description will be given first of the growth of the n-InP cladding layer 9, the active layer 10, and the p-InP cladding layer 11 of the modulator mesa in the light modulator in the first embodiment of the present invention. The description that follows deals with the configuration of embedding with layers growing in two angular directions in an MOCVD process in an ambient supplemented with HCl.

Figure 3A:
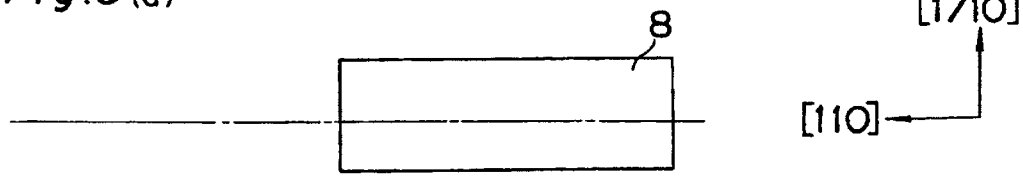
FIGS. 3(a) and 3(b) show the process of embedding growth according to the first embodiment of the present invention.
Figure 3B:
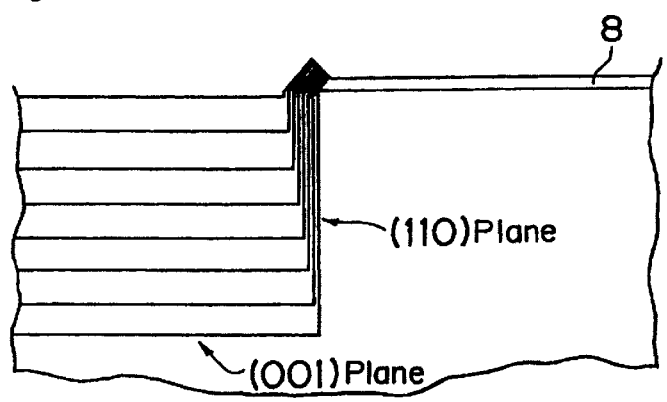

FIG. 3 schematically shows the process of embedding growth of InP in an ambient supplemented with HCl on the laser mesa having a resonance direction coinciding with the [110] direction. As shown in FIG. 3, the growth rate of InP in the (110) plane, which is the end face of the laser mesa, is slower than the growth rate in the (001) plane, which is the bottom surface. This result occurs because of the tendency of HCl to be adsorbed or to decompose depending on the crystalline plane of the substrate. Further, because the addition of HCl accelerates the surface migration of In atoms on the (111)B plane, growth on the (111)B plane, on the mask end, is supplemented. Thus, because the mesa is embedded substantially only by the growth from the (001) bottom surface, a flat embedding growth is achieved.

Figure 4A:
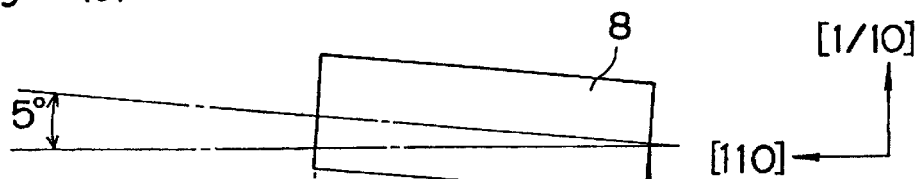
FIGS. 4(a) and 4(b) show the process of growth in a plane inclined by 5 degrees from the (110) plane in FIGS. 3(a) and 3(b).
Figure 4B:
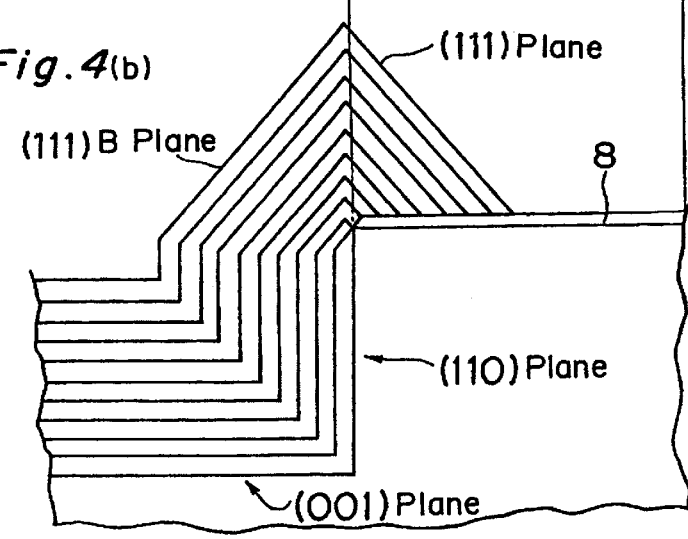

However, when the angle formed by the longitudinal direction of the laser mesa and the [110] direction is 5 degrees or greater (namely, the end face of the mesa does not lie in the (110) plane but forms an angle between 85 degrees and 95 degrees with the [110] direction), the growth rate of InP on the mesa end face of the laser portion is substantially equal to the growth rate on the (001) plane, which is the bottom surface as shown in FIG. 4. Thus, InP grows on the end face of the laser mesa, even when grown in an ambient supplemented with HCl. This causes the growth to proceed from the bottom face, which is the (001) plane, and the end face of the laser mesa, which is the (110) plane, similar to the case where HCl is added, as shown in FIG. 4, and the growing crystal gradually overlaps the SiO$_2$ stripe mask 8 due to the growth on the (111)B plane.

According to the first embodiment of the present invention, by making use of the phenomenon described above, the end face of the laser mesa is arranged at an angle between 85 degrees and 95 degrees with the [110] direction), while the n-InP cladding layer 9, the absorption layer 10, and the p-InP cladding layer 11 of the modulator mesa in the light modulator portion are formed by MOCVD in an ambient supplemented with HCl. With this arrangement, it is possible to suppress crystalline growth on the end face of the laser mesa and, as shown in FIG. 1, to prevent the cladding layer 11 from swelling at the junction, while making the end faces of the active layer 3 and the absorption layer 10 close to and opposite each other.

Figure 2:
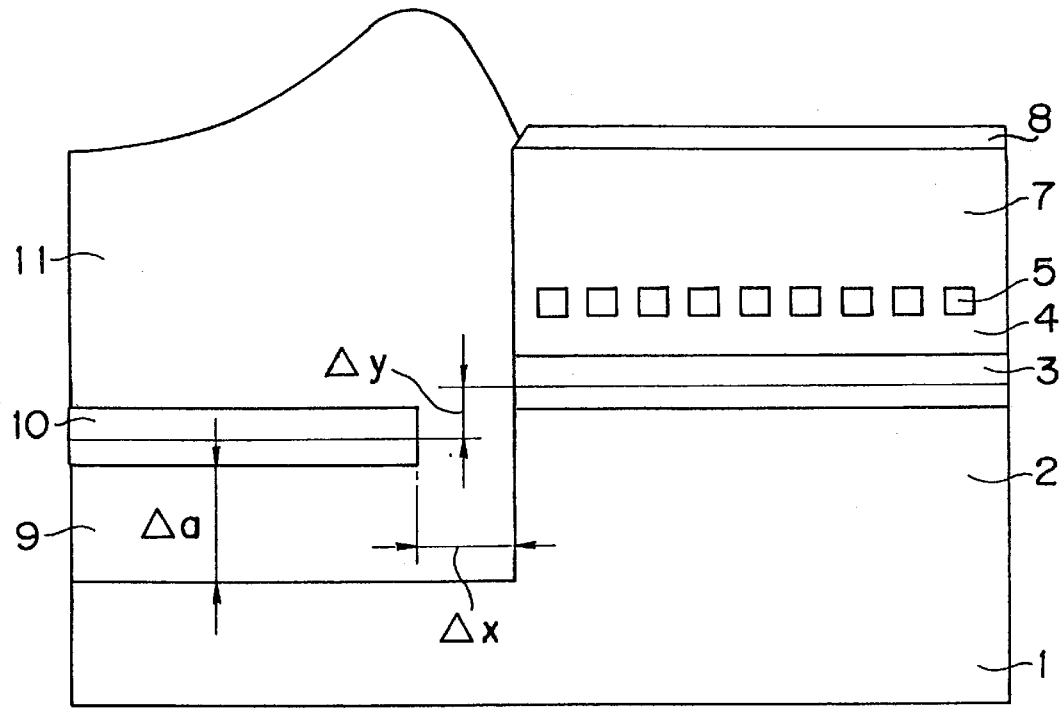
FIG. 2 is a cross-sectional view of the junction used in evaluating the semiconductor laser diode and a light modulator.

The relative positions of the active layer 3 and the absorption layer 11 and the coupling efficiency are described with reference to FIG. 2. A calculation based on the assumption that the refractive index of the active layer 3 is 3.17 and the refractive index of the absorption layer 10 is 3.50 in the first embodiment, shows that achieving a coupling efficiency of 95% or higher makes it necessary to limit the distance $\Delta x$ between the end faces of the active layer 3 and the absorption layer 10 to within 0.5 $\mu$m and to limit the vertical positional displacement $\Delta y$ between the active layer 3 and the absorption layer 10 within 0.1 $\mu$m. It is also necessary to keep a space Δa of 0.5 μm or greater between the substrate 1 surface and the absorption layer, because impurities, such as Si, accumulate on the surface. That is, the thickness of the n-InP cladding layer 9 is required to be 0.5 μm or larger.

Figure 11:
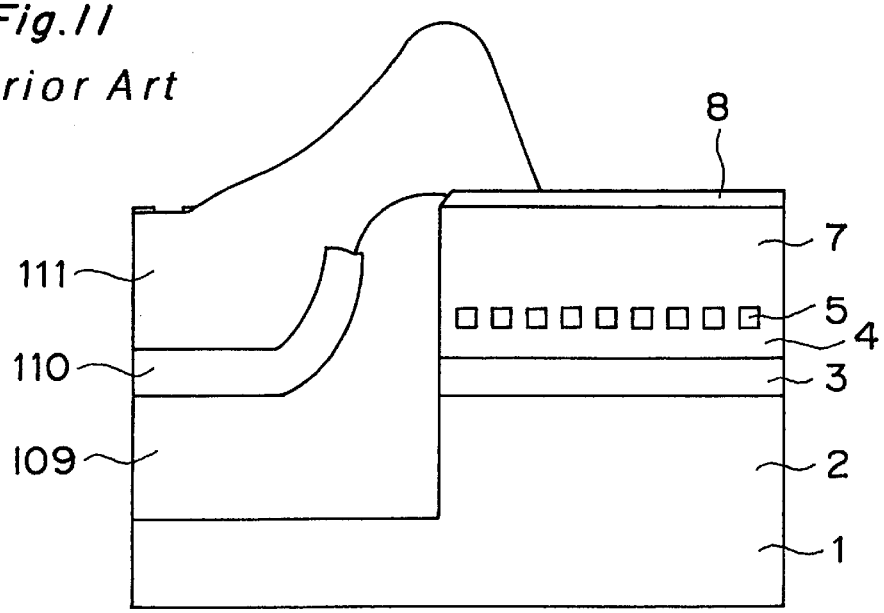
FIG. 11 is a cross sectional view showing, schematically, the junction of a semiconductor laser diode and a light modulator of the prior art.
Figure 12:
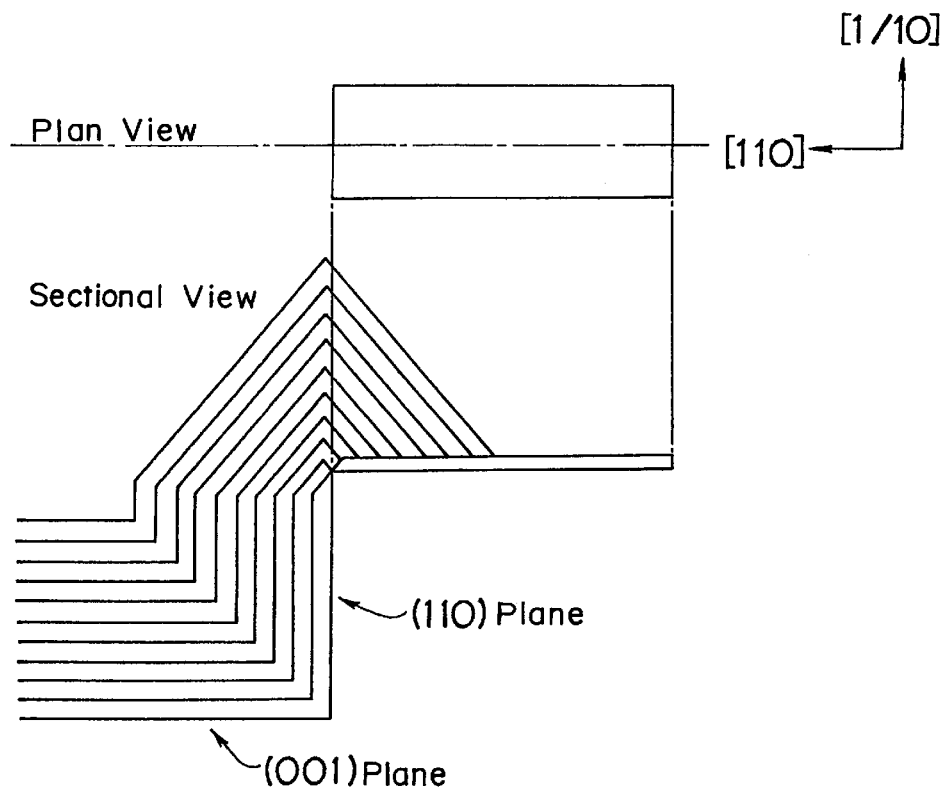
FIG. 12 shows the process of embedding the junction of the semiconductor laser diode and a light modulator of the prior art.

Consequently, when the modulator mesa is formed in an ambient without added HCl as in the prior art, the distance Δx between the active layer 3 and the absorption layer 110 increases, (i.e., is 0.5 μm or larger) as shown in FIG. 11, making it impossible to have the end faces of the active layer 3 and the absorption layer 110 opposed to each other and resulting in insufficient coupling efficiency.

On the other hand, in the first embodiment of the present invention as described, because the growth rate on the (110) end face of the laser mesa is extremely low (substantially zero) when growing the n-InP cladding layer 9, the absorption layer 10, and the p-InP cladding layer 11, the end face of the active layer 3 and the end face of the absorption layer 10 oppose each other and the space between the end faces can be kept small (within 0.5 μm), even when the n-InP cladding layer 9 is thick.

Figure 5A:
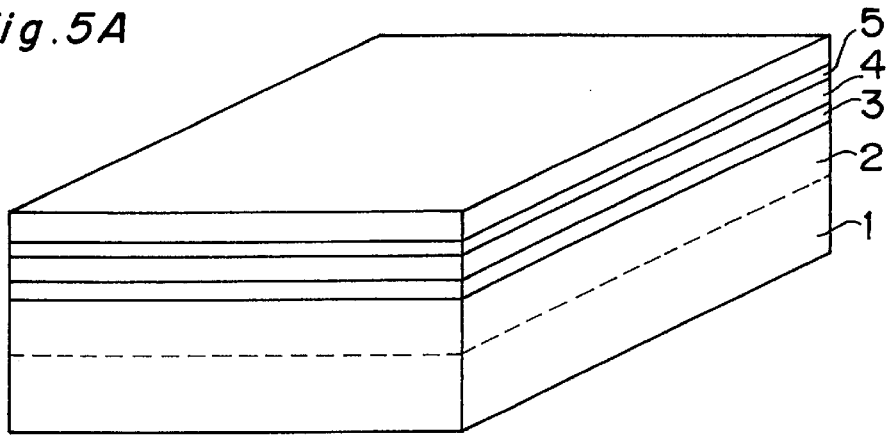
FIGS. 5A, 5B, and 5C show steps of producing a semiconductor laser diode and a light modulator according to the first embodiment of the present invention.
Figure 5B:
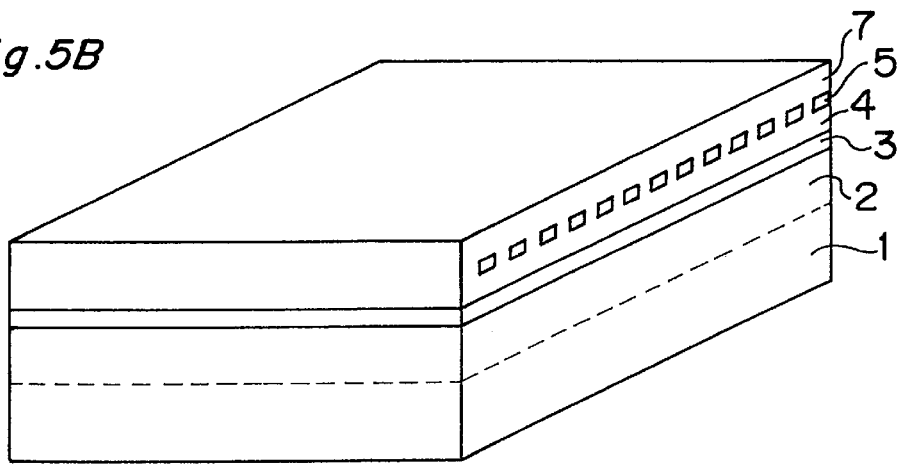

The method for producing the semiconductor laser diode and light modulator according to the first embodiment of the present invention is described. In this method, (1) an n-InP cladding layer 2 having a thickness of 1.8 μm and doped with sulfur in a concentration of $1 \times 10^{18}$ cm$^{-3}$;

(2) an active layer 3 (undoped) having an InGaAs/InGaAsP MQW structure and a thickness of 0.1 μm producing laser light at a wavelength of 1.55 μm;

(3) a p-InP cladding layer 4 having a thickness of 0.1 μm and doped with zinc in a concentration of $1 \times 10^{18}$ cm$^{-3}$;

(4) a p-InGaAsP guide layer 5 having a thickness of 40 nm and doped with zinc in a concentration of $1 \times 10^{18}$ cm$^{-3}$; and (5) a p-InP cap layer 6 having a thickness of 10 nm and doped with zinc in a concentration of $1 \times 10^{18}$ cm$^{-3}$ are grown successively by MOCVD on the n-InP semiconductor substrate 1 so that the crystalline plane of the top surface has a (001) orientation as shown in FIG. 5A.

Then, the p-InGaAsP guide layer 5 is removed at 240 nm intervals in the [110] direction by interference exposure and etching, and a p-InP cladding layer 7 doped with as zinc in a concentration of $1 \times 10^{18}$ cm$^{-3}$ is grown to a thickness of 0.7 μm by MOCVD. Over the entire surface, an SiO$_2$ film is deposited by sputtering and an SiO$_2$ stripe mask 8 is formed with a longitudinal direction along the [110] direction (10 μm wide and 500 μm long). The SiO$_2$ stripe mask 8 is used to form a laser mesa, such as that shown in FIG. 5C, by C$_2$H$_6$/H$_2$-based reactive ion etching (RIE). The n-InP cladding layer 2 is etched half way so that the height of the laser mesa is 2.0 μm.

Figure 6A:
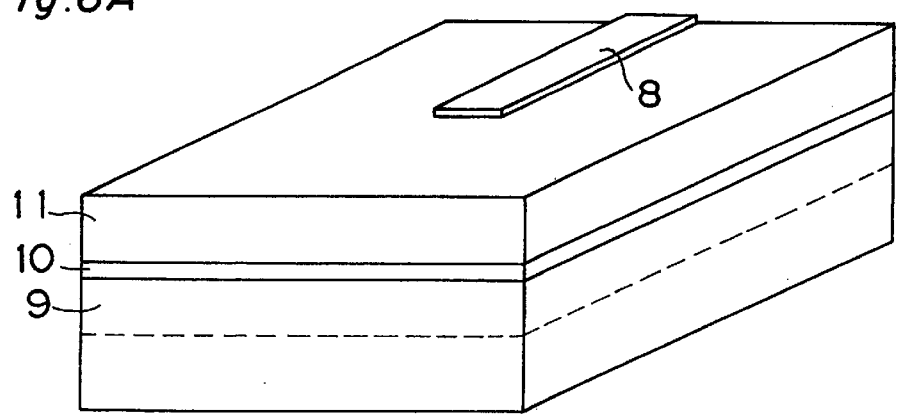
FIGS. 6A, 6B, and 6C show steps of producing a semiconductor laser diode and a light modulator according to the first embodiment of the present invention.

Then, (1) an n-InP cladding layer 9 having a thickness of 1.8 μm and doped with sulfur in a concentration of $1 \times 10^{18}$ cm$^{-3}$;

(2) an absorption layer 10 (undoped) having an InGaAsP/AlInAs MQW structure and a thickness of 0.1 μm, producing light at a wavelength of 1.55 μm; and (3) a p-InP cladding layer 11 having a thickness of 0.8 μm and doped with zinc in a concentration of $1 \times 10^{18}$ cm$^{-3}$, are grown by MOCVD with the SiO$_2$ stripe mask 8 being used as a selective growth mask, as shown in FIG. 6A, to embed the laser mesa, in an ambient supplemented with HCl. In this process, because the layers are grown in the ambient supplemented with HCl, growth on the end face of the laser mesa is suppressed and, consequently, the p-InP cladding layer 11 is not formed on the SiO$_2$ stripe mask 8.

Figure 6B:
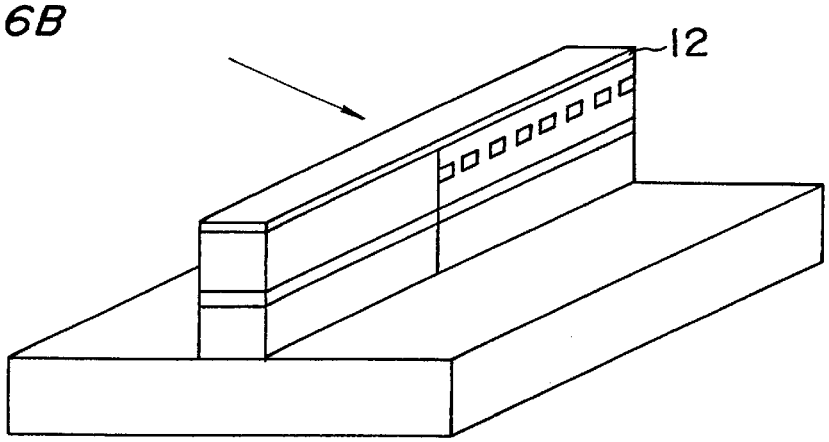
Figure 6C:
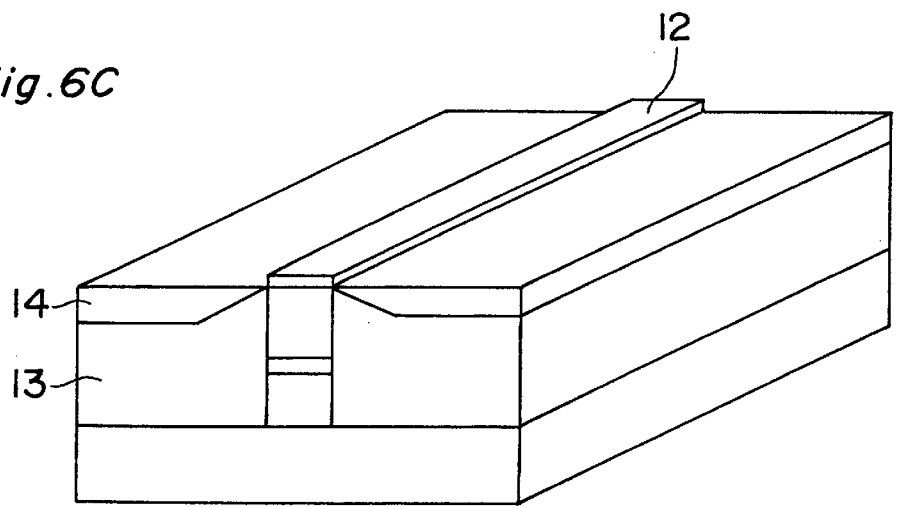

After removing the SiO$_2$ stripe mask 8, an SiO$_2$ film is vapor-deposited over the entire surface by sputtering, and an SiO$_2$ stripe mask 12 is formed in the [110] direction by photolithography. The width of the SiO$_2$ stripe mask 12 is 1.5 μm, i.e., narrower than the SiO$_2$ stripe mask 8. Then the SiO$_2$ stripe mask 12 is used to form a mesa structure, wherein a laser mesa and a modulator mesa are connected as shown in FIG. 6B, by C$_2$H$_6$/H$_2$-based RIE. Mesa etching is carried out so that the height of the laser mesa is 3.5 μm. An Fe-InP embedding layer 13 doped with Fe in a concentration of $4 \times 10^{16}$ cm$^{-3}$ is grown to a thickness of 3.0 μm on both sides of the mesa. Thereafter, an n-InP current blocking layer 14 doped with an n-type impurity in a concentration of $7 \times 10^{18}$ cm$^{-3}$ is grown to a thickness of 0.5 μm (FIG. 6C). In this process, the Fe-InP embedding layer 14 can be planar without overlapping the SiO$_2$ stripe mask 12 as shown in FIG. 6C by being grown while adding HCl to the ambient.

Figure 7A:
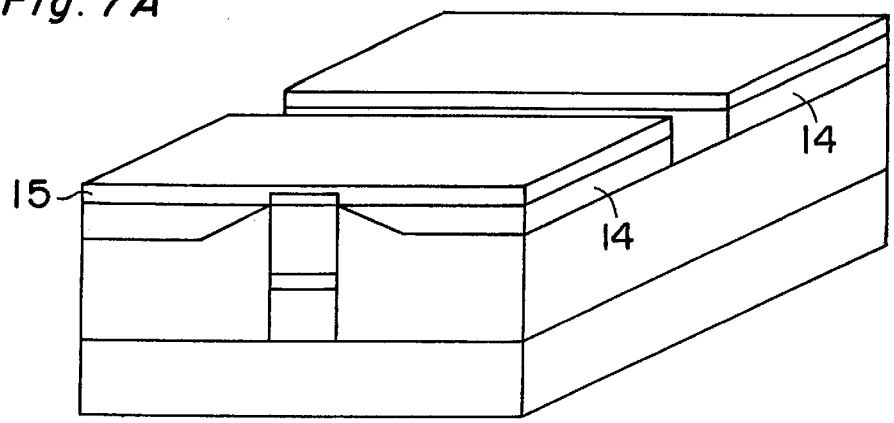
FIGS. 7A, 7B, and 7C show steps of producing a semiconductor laser diode and a light modulator according to the first embodiment of the present invention.
Figure 7B:
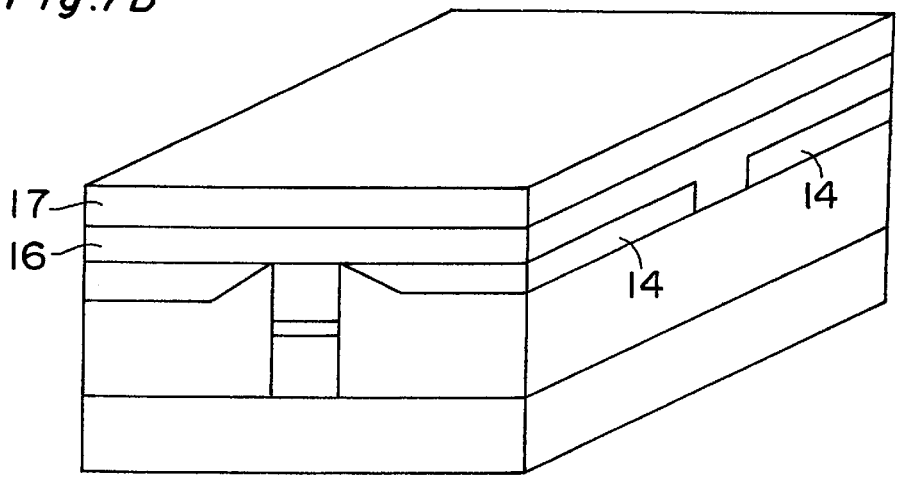

A resist 15 which has an opening 30 μm wide and runs from one side face to the other side face is formed in the [1/10] direction over the junction, between the laser mesa and the modulator mesa, as shown in FIG. 7A, and the n-InP current blocking layer 14 is removed from the isolation region through the opening by RIE. Because the top surface of the mesa is covered with the SiO$_2$ stripe mask 8, it is not damaged by RIE. After removing the resist 15 and the SiO$_2$ stripe mask 12, a p-InP cladding layer 16 doped with an impurity in a concentration of $1 \times 10^{18}$ cm$^{-3}$ and having a thickness of 1.5 μm, and a p-InGaAs contact layer 17 doped with an impurity in a concentration of $7 \times 10^{18}$ cm$^{-3}$ and having a thickness of 0.5 μm, are grown successively, as shown in FIG. 7B.

Figure 7C:
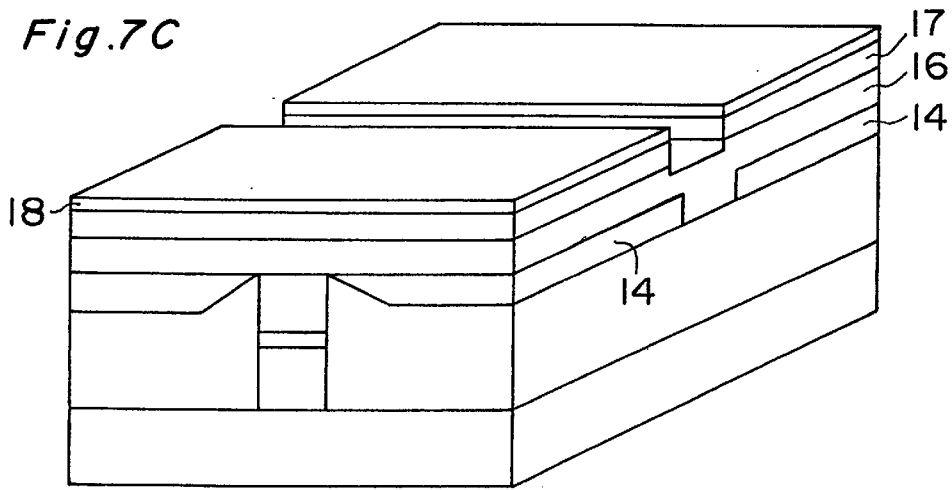
Figure 8A:
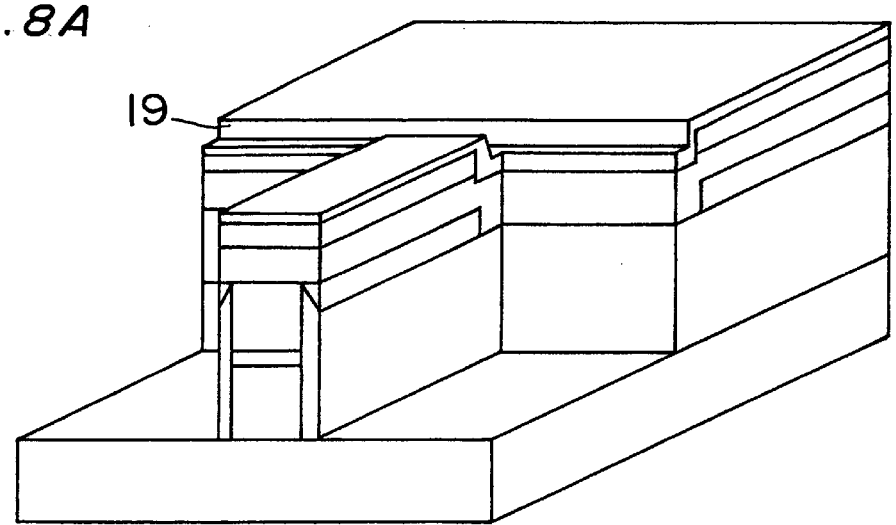
FIGS. 8A and 8B show steps of producing a semiconductor laser diode and a light modulator according to the first embodiment of the present invention.
Figure 8B:
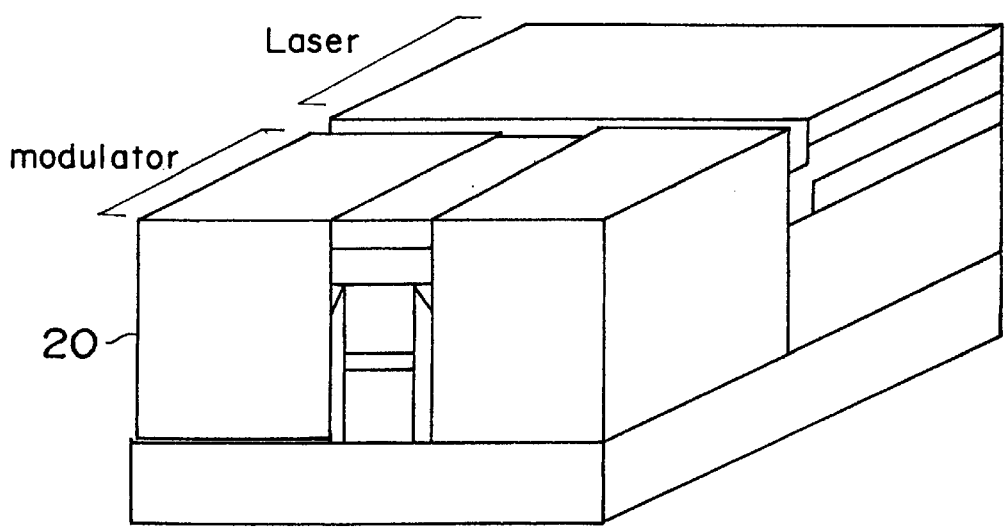

A resist 18 having an opening in the isolation region, similar to the resist 15, is formed as shown in FIG. 7C, and the p-InGaAs contact layer 17 is removed from the isolation region through the opening. At this time, the p-InP 16 cladding layer is removed to a depth of about 1 μm from the surface. Then, after removing the resist 18, an SiO$_2$ film is deposited over the entire surface by sputtering, and an SiO$_2$ mask 19 is formed, covering the entire surface of the laser and the modulator mesa of the light modulator by photolithography, as shown in FIG. 8A. The projecting portion (modulator portion) of the SiO$_2$ mask 19 has a length of 150 μm and a width of 3 μm, which is greater than the width of the SiO$_2$ stripe mask 12 shown in FIG. 6B. With the SiO$_2$ mask 19 used as an etching mask, both sides of the modulator mesa are etched to a depth of 1 μm from the surface by RIE. The etched portions are filled with polyimide 20 (FIG. 8B). After removing the SiO$_2$ mask 19, electrodes are formed on the front and back sides, and the crystalline structure is cleaved in a direction perpendicular to the resonance direction and the cleaved surface is coated. The semiconductor laser diode including a light modulator of the first embodiment of the present invention can be made by the processes described above.

The laser region of the semiconductor laser diode and a light modulator of the first embodiment described above is called a DFB (distributed feedback) laser. The laser region continuously oscillates when a forward bias is applied, with the generated laser beam being transmitted through the junction to the absorption layer 10 of the light modulator, modulated in response to the bias voltage applied to the light modulator region, and output. When a bias voltage is not applied to the absorption layer 10 of the light modulator region, the laser beam is output from the end face of the modulator.

In this case, the wavelength of the laser beam output from the active layer 3 having the InGaAs/InGaAsP MQW structure is greater than the absorption wavelength of the absorption layer 10 having an InGaAsP/AlInAs MQW structure and is, therefore, not absorbed in the absorption layer 10. When a reverse bias is applied to the modulator, because the absorption wavelength of the absorption layer 10 having the InGaAsP/AlInAs MQW structure increases due to the Stark effect, the laser beam is absorbed in the absorption layer 10 and does not emerge from the modulator end face. To suppress electrical cross-talk when a reverse bias and a forward bias are applied to the light modulator region and the semiconductor laser region, respectively, the n-InP current blocking layer 14, the p-InGaAs contact layer 17, and the p-InP cladding layer are partially removed to form the isolation region.

As described above, the laser beam generated in the laser oscillation region can be modulated at a frequency as high as 40 GHz by applying a reverse bias modulated at a high speed to the light modulator region.

In the semiconductor laser diode and modulator of the first embodiment, the laser mesa has an end face in a (110) plane, while the n-InP cladding layer 9, the absorption layer 10, and the p-InP cladding layer 11 are formed by MOCVD in an ambient supplemented with HCl. This method produces excellent features for the semiconductor laser diode and the modulator of the first embodiment, such as:

(1) The active layer 3 of the laser oscillation region and the absorption layer 11 of the light modulator region are opposite and close to each other, improving the optical coupling efficiency in the junction of the active layer 3 and the absorption layer 11.

The present inventor and colleagues verified that the distance between the end face of the active layer 3 and the end face of the absorption layer 11 can be about 0.02 $\mu$m when the n-InP cladding layer has a thickness of 0.5 $\mu$m. It is expected that the distance can further be reduced to substantially zero by optimizing conditions.

(2) Because swelling of the p-InP cladding layer 11 at the junction can be made extremely small, the n-InP current blocking layer 14 can be completely removed from the isolation region at the junction and, therefore, extremely good isolation can be achieved between the laser oscillation region and the light modulator region (namely, electrical cross-talk can be suppressed).

Embodiment 2

A semiconductor laser diode and a modulator according to a second embodiment of the present invention is described. The semiconductor laser diode and light modulator is formed similarly to the semiconductor laser diode and light modulator of the first embodiment except that an end face of the laser mesa of the laser region that opposes the light modulator is formed at an angle of 45 degrees from the [110] direction, as shown in FIG. 10.

Figure 5C:
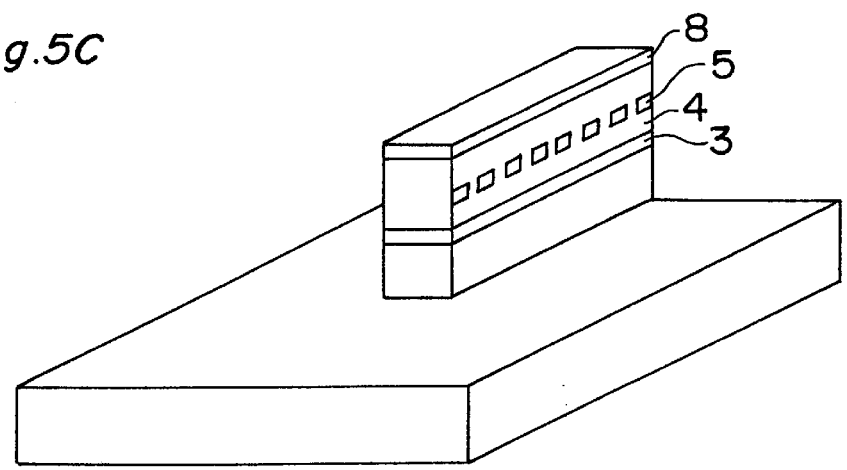
Figure 10:
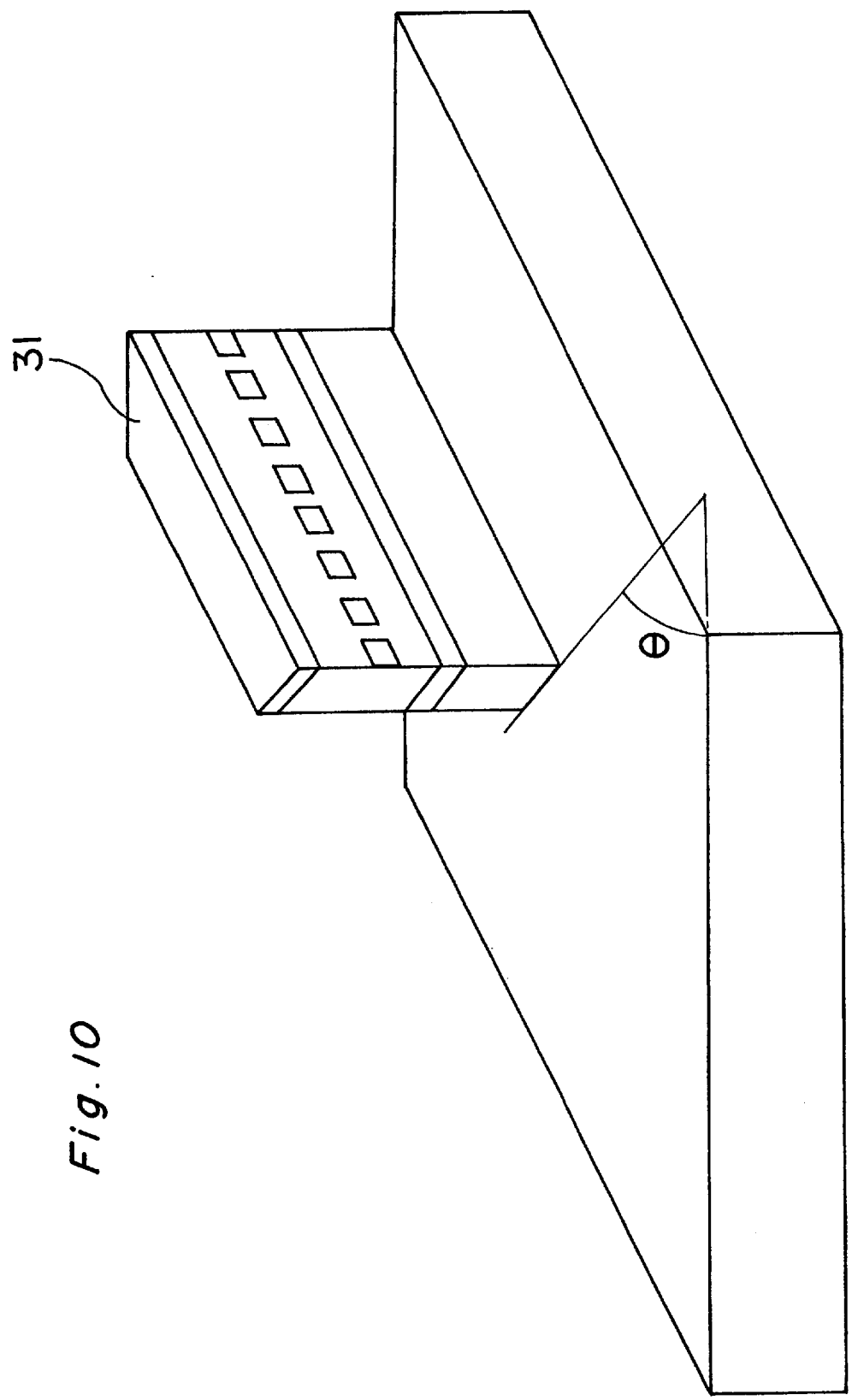
FIG. 10 is a perspective view showing the configuration of the laser mesa of a semiconductor laser diode and a light modulator according to a second embodiment of the present invention.

The SiO$_2$ stripe mask 8 of the first embodiment shown in FIG. 5C is replaced with an SiO$_2$ stripe mask 31 at an angle of 45 degrees from the [110] direction, as shown in FIG. 10. The mask 31 is used in etching to form a laser mesa having an end face inclined at an angle of 45 degrees from the [110] direction. Then, the n-InP cladding layer 9, the absorption layer 10, and the p-InP cladding layer 11 are formed by MOCVD in an ambient supplemented with HCl.

The second embodiment makes use of the suppression of crystalline growth in a plane inclined at an angle of 45 degrees from the [110] direction when grown in an ambient supplemented with HCl. As a result, in the second embodiment, the end face of the active layer 3 and the end face of the absorption layer 10 oppose and are close to each other, improving optical coupling efficiency.

According to the second embodiment, because crystalline growth in the (111) plane is suppressed, even when the n-InP cladding layer 9, the absorption layer 10, and the p-InP cladding layer 11 are grown in an ambient without HCl, swelling of the p-cladding layer in the junction is smaller in comparison to the prior art, preventing overlapping over the SiO$_2$ stripe mask 31. As a result, isolation between the laser region and the light modulator region is improved even when the layers of the light modulator are grown in an ambient without HCl. However, growing in an ambient supplemented with HCl allows the end face of the active layer 3 and the end face of the absorption layer 10 to be brought closer to each other, thereby further improving coupling efficiency.

The semiconductor laser diode and the light modulator of the second embodiment has, in addition to the effects of the first embodiment, suppressed reflection of light at the junction surfaces because the end face of the active layer 3 and the end face of the absorption layer 10 are inclined at an angle of 45 degrees from the incident direction of light. Therefore, the optical coupling efficiency is improved compared to the first embodiment. Although the laser mesa having an end face inclined at an angle of 45 degrees from the [110] direction is used in the second embodiment, the present invention is not limited to this configuration and effects similar to those of this second embodiment can be achieved when the end face and the [110] direction form any angle from 0 degrees to 45 degrees.

Embodiment 3

The third embodiment applies the method of controlling the crystalline growth orientation described for the first and second embodiments to the formation of an optical waveguide on the semiconductor substrate, while the optical waveguide of the third embodiment is formed in the procedure illustrated in FIGS. 9A–9D.

Figure 9A:
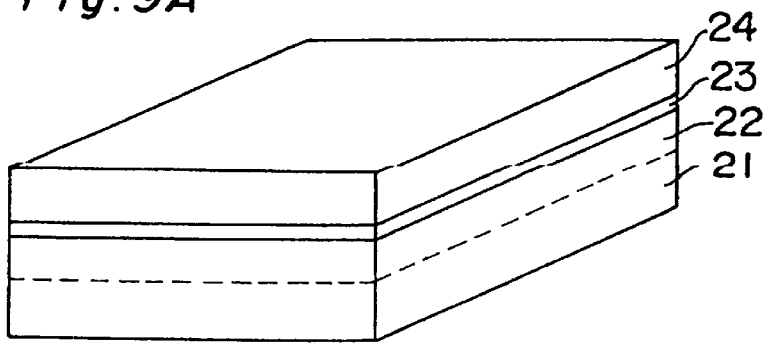
FIGS. 9A, 9B, 9C, and 9D are perspective views and FIG. 9(b1) is a plan view, all showing major steps of a process of producing a composite optical device according to a third embodiment of the present invention.

First, as shown in FIG. 9A, (1) an n-InP buffer layer 22 having a thickness of 1.8 $\mu$m and doped with sulfur in a concentration of $1 \times 10^{18}$ cm$^{-3}$;

(2) an optical waveguide layer 23 (undoped) having an InGaAsP/InGaAsP MQW structure and a thickness of 0.1 $\mu$m, producing light with a wavelength of 1.30 $\mu$m; and (3) a p-InP cladding layer 24 having a thickness of 0.7 $\mu$m and doped with zinc in a concentration of $1 \times 10^{18}$ cm$^{-3}$, are grown successively by MOCVD on a surface of an n-InP semiconductor substrate 21 which lies in the (001) plane, as shown in FIG. 9A.

Figure 9B:
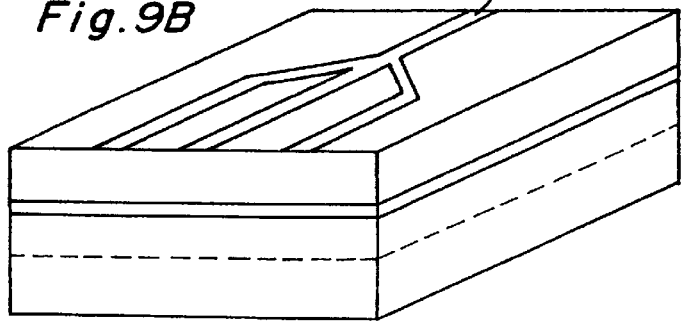
Figure 9:
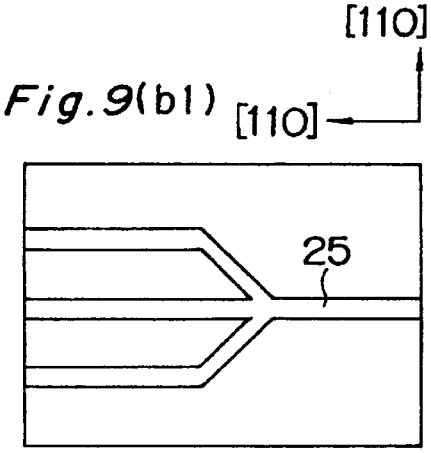
Figure 9C:
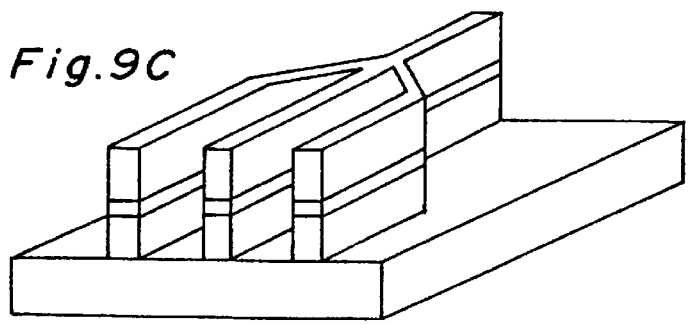
Figure 9D:
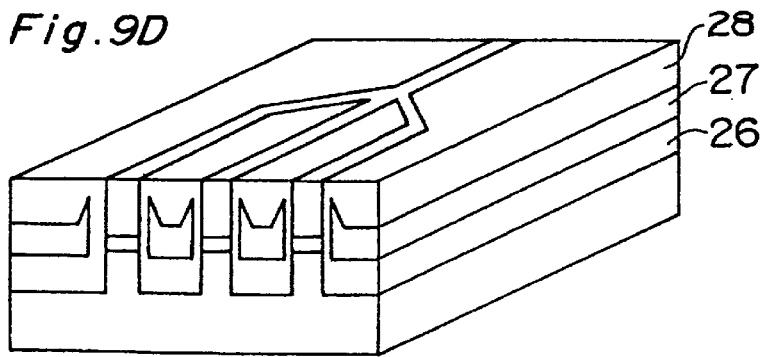

Then, an SiO$_2$ film is deposited over the entire surface by sputtering and an SiO$_2$ stripe mask 25, shown in perspective and plan views in FIGS. 9B and 9(b1), is formed by photolithography.

The stripe mask 25 has longitudinal edges inclined by either ±5 degrees from the [1/10] direction or ±45 degrees from the [110] direction. The SiO$_2$ stripe mask 25 is used to form a mesa, such as that shown in FIG. 9C, by C$_2$H$_6$/H$_2$-based RIE. The mesa is formed by etching so that the height of the mesa is 2.0 $\mu$m.

Then, the SiO$_2$ stripe mask 25 is used as a selective growing mask to grow:

(1) a p-InP embedding layer 26 having a thickness of 0.2 $\mu$m and doped with zinc in a concentration of $8 \times 10^{17}$ cm$^{-3}$;

(2) an n-InP current blocking layer 27 having a thickness of 1.2 $\mu$m and doped with sulfur in a concentration of $7 \times 10^{18}$ cm$^{-3}$; and (3) a p-InP embedding layer 28 having a thickness of 0.6 μm and doped with zinc in a concentration of $8 \times 10^{17}$ cm$^{-3}$, successively by MOCVD. Then the SiO$_2$ stripe mask 25 is removed.

In the optical waveguide of the third embodiment, crystalline growth on the side face of the mesa is suppressed when growing the p-InP embedding layer 26, the n-InP current blocking layer 27, and the p-InP embedded layer 28. Therefore, the embedding layer 28 is prevented from swelling at the end of the optical waveguide, so that a planar embedding layer is formed. Thus, the optical device with the optical waveguide and the embedding layer 28 of the third embodiment is formed. The optical waveguide of the third embodiment is suited for the composite optical device.

Although the first, second, and third embodiments use an n-InP substrate 1, the present invention is not limited to this substrate, which may be a p-InP substrate.

In the first, second, and third embodiments, the layers are InP-based semiconductor materials on the n-InP substrate 1, but other compound semiconductor substrates, such as GaAs, and layers of other semiconductor materials, such as GaAs, may be used. Further, although an ambient supplemented with HCl is used in the MOCVD process in the first, second, and third embodiments, the present invention is not limited to this arrangement. An ambient supplemented with CH$_3$Cl, CCl$_4$, or the like may be employed. In short, an ambient including at least Cl may suffice for the purpose of the present invention.

Similar effects as those of the first, second, and third embodiments can be achieved through the arrangements described above.

What is claimed is:

1. A composite optical device comprising:

a compound semiconductor substrate having a (001) surface;

first and second cladding layers on the surface and having respective thicknesses;

a laser diode including a first mesa having an active layer on the first cladding layer; and an optical device including a second mesa having an optical waveguide layer on the second cladding layer wherein an end of the active layer opposes an end of the optical waveguide layer and the ends are separated from each other by a distance, the distance being smaller than the thickness of the second cladding layer.

2. The composite optical device as claimed in claim 1, wherein the end of the first mesa forms an angle in a range from 0 to 45 degrees, inclusive, with the [110] direction.

3. The composite optical device as claimed in claim 2, wherein the direction of the active layer substantially corresponds to the [110] direction.

4. The composite optical device as claimed in claim 1, wherein the end of the first mesa forms an angle less than ±5 degrees with the [110] direction.

5. The composite optical device as claimed in claim 1, wherein the distance between the end of the active layer and the end of the optical waveguide layer is not greater than 0.5 μm.

6. The composite optical device as claimed in claim 1, wherein the optical device is a light modulator and the optical waveguide layer changes in light absorption in accordance with an applied electric field.

7. The composite optical device as claimed in claim 1, wherein the first mesa has a direction substantially in the [110] direction and an end of the first mesa, which includes the end of the active layer, is substantially at a right angle to the [110] direction.

8. The composite optical device as claimed in claim 7, wherein the end of the first mesa forms an angle in a range from 85 to 95 degrees with the [110] direction.

* * * * *